United States Patent
Breitwisch et al.

(10) Patent No.: US 7,560,721 B1
(45) Date of Patent: Jul. 14, 2009

(54) PHASE CHANGE MATERIAL WITH FILAMENT ELECTRODE

(75) Inventors: Matthew J. Breitwisch, Yorktown Heights, NY (US); Roger W. Cheek, Somers, NY (US); Eric A. Joseph, White Plains, NY (US); Chung H. Lam, Peekskill, NY (US); Alejandro G. Schrott, New York, NY (US); Gerhard Ingmar Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/035,237

(22) Filed: Feb. 21, 2008

(51) Int. Cl.
*H01L 47/00* (2006.01)
(52) U.S. Cl. .......................................................... 257/2
(58) Field of Classification Search ................ 257/2, 257/3
See application file for complete search history.

(56) References Cited

U.S. PATENT DOCUMENTS

2003/0035315 A1\* 2/2003 Kozicki ...................... 365/171

2006/0027893 A1 2/2006 Meijer et al.
2008/0304311 A1\* 12/2008 Philipp et al. ............... 365/148

OTHER PUBLICATIONS

T. Sakamoto et al., A Nonvolatile Programmable Solid Electrolyte Nanometer Switch, IEEE International Solid-State Circuits Conference, 2004, Session 16.
C. Rossel et al., Electrical Current Distribution Across a Metal-Insulator-Metal Structure During Bistable Switching, Journal of Applied Physics, 2001, pp. 2892-2898, vol. 90, No. 6.
S. Karg et al., Nanoscale Resistive Memory Device Using SrTiO3 Films, IBM Research, Zurich Research Laboratory, Ruschlikon, Switzerland.

\* cited by examiner

*Primary Examiner*—Tung S Lau
*Assistant Examiner*—Lawrence Tynes, Jr.
(74) *Attorney, Agent, or Firm*—Scully, Scott, Murphy & Presser, P.C.; Vazken Alexanian, Esq.

(57) ABSTRACT

The present invention, in one embodiment, provides a memory device that includes a phase change memory cell; a first electrode; and a layer of filamentary resistor material positioned between the phase change memory cell and the first electrode, wherein at least one bistable conductive filamentary pathway is present in at least a portion of the layer of filamentary resistor material that provides electrical communication between the phase change memory cell and the first electrode.

15 Claims, 2 Drawing Sheets

PHASE CHANGE MATERIAL WITH FILAMENT ELECTRODE

FIELD OF THE INVENTION

The present invention relates generally to microelectronics. In one embodiment, the present invention relates to memory devices having a filament electrode structure.

BACKGROUND OF THE INVENTION

Materials displaying the ability to be reversibly switched between two stable electrical resistance states have been proposed for use in nonvolatile memories. When incorporated in a memory cell, such materials can be toggled between higher and lower electrical resistance states by applying a pulse of electrical current ("switching current pulse") to the materials. Subsequently, after writing to a memory cell in this way, the electrical resistance state of the given memory cell can be determined (i.e., read) by applying a sensing current pulse to the material in order to determine its electrical resistance state. The amplitude of the sensing current pulse preferably is sufficiently smaller than the amplitude of the switching current pulse so that the electrical resistance state of the material is not altered by the read operation, and the written electrical resistance state persists.

Chalcogenides are one group of materials that have been proposed for use in nonvolatile memory cells because many materials within this group manifest two stable physical states having different electrical resistances. A chalcogenide typically comprises germanium, antimony, sulfur, selenium or tellurium or a combination thereof. When incorporated into a properly configured memory cell, a chalcogenide can be forced to transition between a higher electrical resistance amorphous state and a lower electrical resistance polycrystalline state by applying a switching current pulse. The electrical resistance state into which a chalcogenide is placed is dependent on the amplitude of the applied switching current pulse rather than its direction.

Another group of materials displaying two stable electrical resistance states comprises transition metal oxides. While the mechanism for the memory effect remains under study, the materials within this class, when incorporated into a properly configured memory cell reproducibly and reversibly undergo a transition from one stable electrical resistance state to a different stable electrical resistance state in response to an applied switching current pulse. However, unlike chalcogenides, the transition from one resistance state to the other in transition metal oxides is not only dependent on the amplitude of the switching current pulse, but rather is dependent on its direction. In other words, a switching current pulse must have a particular direction of current flow in order to cause a transition metal oxide to transition between one electrical resistance state and its other electrical resistance state.

In the case of both chalcogenides and transition metal oxides, the ratio between the higher and lower electrical resistance states is typically between about 100:1 and 1,000:1. Moreover, the higher and lower electrical resistance states have been shown to persist for time periods on the order of months without being refreshed.

SUMMARY OF THE INVENTION

The present invention, in one embodiment provides a memory device that includes an electrical contact between a memory cell and an electrode that is provided by at least one bistable conductive filamentary pathway. In one embodiment, the inventive memory device includes:
  a phase change memory cell;
  a first electrode; and
  a layer of a filamentary resistor material positioned between the phase change memory cell and the first electrode, wherein at least one bistable conductive filamentary pathway is present in at least a portion of the layer of filamentary resistor material that provides electrical communication between the phase change memory cell and the first electrode.

In one embodiment, in accordance with the present invention, the phase change memory cells may be conditioned so they exhibit a hysteresis in the current voltage characteristics, that is, a bistable resistance state. In one embodiment, the electrical communication between the phase change memory cell and the first electrode is provided by at least one bistable conductive filamentary pathway that is present through the layer of filamentary resistor material and extends from the first electrode to the phase change memory cell. In one embodiment, the bistable conductive filamentary pathway exhibits a low-resistance state of about 4 K ohm and a high-resistance state of about 400 K ohm (measured with a bias of less than 0.5 volts) after applying a small bias voltage of typically less than about +/−2 volts to switch the resistivity state.

In one embodiment, the two different resistivity states persist after removal of the applied electrical bias. In one embodiment, the conditioning (or forming process) consists of applying a larger voltage (typically 5 volts) across the material until a current of predetermined magnitude (typically 10 to 50 microamps) starts flowing. The required polarity of the forming voltage depends on the electrode material. The formation of the bistable conductive filamentary pathway typically begins at the cathode.

In one embodiment, the layer of the filamentary resistor material comprises a transition metal oxide. In one embodiment, the phase change memory cell comprises Ge, Sb, or Te or a combination thereof. In one embodiment, the phase change memory cell comprises $Ge_2Sb_2Te_5$, GeSb, SbTe, or combinations thereof. In one embodiment, the first electrode comprises a metal comprising Al, Ti, Cu, Ru, Rh, Pd, Ag, Ta, W, ft, Pt, or alloys and combinations thereof. In another embodiment, the first electrode comprises a barrier metal, which may be selected from TiN, TaN or a combination thereof. In one embodiment, the present memory device further includes a barrier metal layer on a surface of the phase change material opposite the surface of the phase change material that is in direct physical contact with the layer of the filament resistor material, wherein the barrier metal layer may comprise TiN or TaN.

In one embodiment, the memory device further includes a second electrode in contact with the surface of the phase change memory cell that is opposite the surface of the phase change memory cell that is in direct physical contact with the layer of filamentary resistor material. In one embodiment, a barrier metal layer is positioned between the second electrode and the phase change memory cell.

In one embodiment, the memory device includes a switching region at the contact of the bistable conductive filamentary pathway to the phase change memory cell. In one embodiment, the switching region is in an amorphous stage prior to the application of a voltage to the first electrode and is in a crystalline stage upon the application of a voltage to the first electrode. In one embodiment, following the application of a voltage to the first electrode, the switching region converts back to an amorphous phase once the voltage is removed.

In another aspect of the present invention, a method of forming a memory device is provided, in which the memory device includes at least one bistable conductive filamentary pathway. In one embodiment, the present method of forming a memory device includes:

forming a first electrode;

forming a layer of a filamentary resistor material in electrical communication with the first electrode;

forming a memory cell atop the layer of filamentary resistor material; and applying an electric field to the filamentary resistor material to form at least one bistable conductive filamentary pathway in the filamentary resistor material having at least one surface that is in direct physical contact with the memory cell.

In one embodiment, the layer of filamentary resistor material includes a transition metal oxide, and the memory cell includes a phase change material composed of Ge, Sb, Te or a combination thereof. In one embodiment, the step of applying the electric field to the filamentary resistor material to form the at least one bistable conductive filamentary pathway further includes forming an indentation in the filamentary resistor material prior to the forming of the memory cell atop the filamentary resistor material. In one embodiment, the indentation localizes the electric field during formation of the at least one bistable conductive filamentary pathway. In one embodiment, the application of the electric field to the filamentary resistor includes applying a voltage to at least one of the first electrode and the second electrode.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
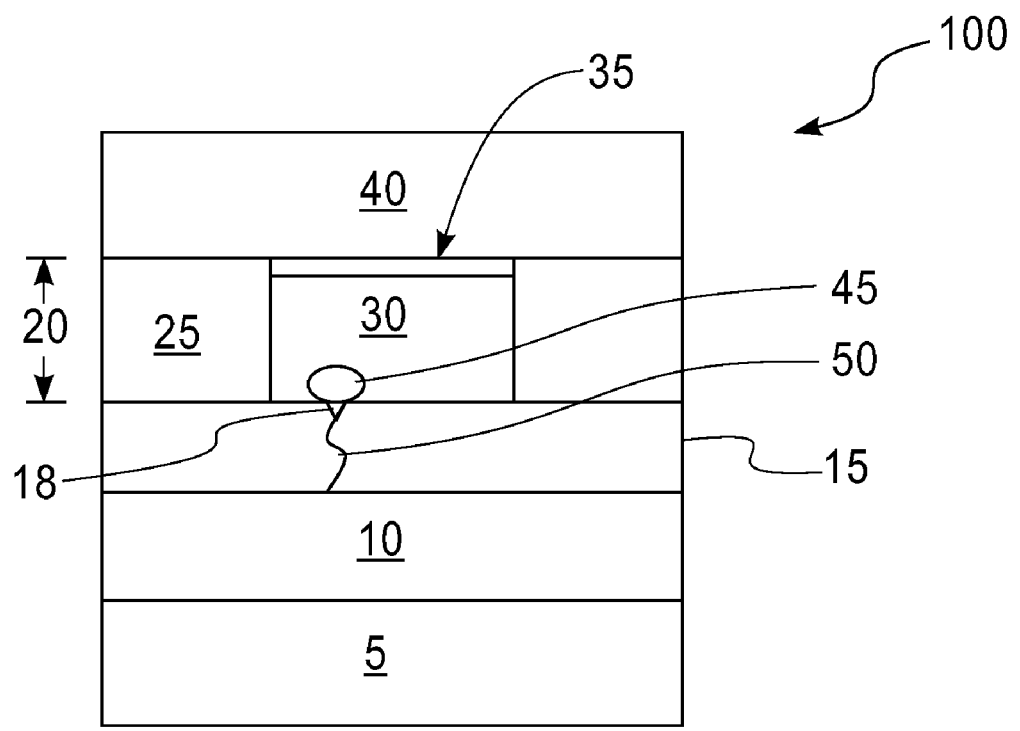
FIG. 1 is a side cross sectional view of one embodiment of a memory device including at least one bistable conductive filamentary pathway to the memory cell of the device, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods and to structures relating to memory devices. When describing the methods, the following terms have the following meanings, unless otherwise indicated.

As used herein, the term "memory device" means a structure in which the electrical state of which can be altered and then retained in the altered state; in this way a bit of information can be stored.

"Volatile memory" means memory in which stored information is lost when power to the memory cell is turned off.

"Nonvolatile memory" means information that is stored is maintained after the power supply is turned off.

The term "bistable" means that two resistance states are obtained upon application of an electrical bias of opposite signs respectively, the resistance states persist after removal of the applied electrical bias.

As used herein, the term "a filamentary resistor material" denotes a material in which a conductive region can be formed through an insulating material by applying an electrical field, thermal field or pressure to the material.

As used herein, the term "filamentary conductive pathway" denotes a conductive pathway extending through the filamentary resistor material.

A "transition metal oxide" is an oxide formed form any element in the d-block of the Periodic Table of Elements, excluding zinc, cadmium and mercury. The d-block of the Periodic Table of Elements corresponds to groups 3 to 12.

A "complex metal oxide" is an oxide formed from any element in the d-block of the Periodic Table of Elements, excluding zinc, cadmium and mercury, and which may include elements from group 2 of the Periodic Table of Elements.

As used throughout the present disclosure, the term "electrode" denotes a terminal or surface at which electricity passes from one material or medium to another.

As used herein, an "anisotropic etch process" denotes a material removal process in which the etch rate in the direction normal to the surface to be etched is much higher than in the direction parallel to the surface to be etched.

As used herein, "insulating" denotes a room temperature conductivity of less than about $10^{-10}$ $(\Omega\text{-m})^{-1}$.

"Conductive", "electrically conductive" and/or "electrically communicating" as used through the present disclosure means a material having a room temperature conductivity of greater than $10^{-8}$ $(\Omega\text{-m})^{-1}$.

As used herein, a "metal" is an electrically conductive material, wherein in metals atoms are held together by the force of metallic bond; and the energy band structure of metal's conduction and valence bands overlap, and hence, there is no energy gap.

As used herein, "a conformal layer" is a deposited material having a thickness that remains the same regardless of the geometry of underlying features on which the layer is deposited. A conformal insulating layer is a conformal layer composed of an insulating material.

As used herein, a "barrier metal" is a material used to chemically isolate semiconductors from metal interconnects that provides an electrical connection between them.

As used herein, a "phase change material" denotes a material that converts from an amorphous phase to a crystalline phase upon the application of external energy.

A "phase change memory cell" denotes a memory cell of a phase change material.

The term "direct physical contact" means that the phase change memory cell and the layer of filamentary resistor material are connected in series without any intermediary conducting, insulating or semiconducting layers.

As used herein, the term "amorphous" denotes a non-crystalline solid having no periodicity and long-range order, i.e., no discernable crystalline structure.

As used herein, the term "crystalline" means a solid arranged in fixed geometric patterns or lattices.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIG. 1 depicts one embodiment of a memory device 100 including at least one bistable conductive filamentary pathway 50 to a phase change memory cell 20 of the device. In one embodiment, the present invention provides a nonvolatile memory device that includes a memory cell 20 composed of a phase change material 30 in combination with a filamentary resistor material 15, wherein the phase change material 30 of the memory cell 100 is in direct physical contact with the filamentary resistor material 15.

In one embodiment, the phase change memory cell 20 comprises $Ge_2Sb_2Te_5$, GeSb, SbTe, or a combination thereof. Although, memory cells composed of phase change materials are discussed herein, it is not intended that the invention be limited to only the disclosed memory cell compositions, as the present invention is equally applicable to other memory cell composition and types. For example, in addition to non-volatile memory devices, the present invention is applicable to volatile memory devices.

In one embodiment, the present invention provides a memory device 100 that includes a phase change memory cell 20, a first electrode 10, and a layer of filamentary resistor material 15 positioned between the phase change memory cell 20 and the first electrode 10, wherein at least one bistable conductive filamentary pathway 50 is present in at least a portion of the layer of filamentary resistor material 15. In one embodiment, the at least one bistable conductive filamentary pathway 50 provides electrical communication between the phase change memory cell 20 and the first electrode 10. In one embodiment, the memory device 100 further includes a second electrode 40 that is in contact with the surface of the phase change memory cell 20 that is opposite the surface of the phase change memory cell 20 that is in direct physical contact with the layer of filamentary resistor material 15. In one embodiment, a barrier metal layer 35 is positioned between the second electrode 40 and the phase change memory cell 20.

The bistable filamentary conductive path may have different origins depending on the resistor material. In one embodiment, the filamentary conductive path could be composed of metal atoms driven into a solid electrolyte by the action of an electric field. In another embodiment, the filamentary conductive path could consist of oxygen non-stoichiometry (for example oxygen vacancies) in transition metal oxides or complex metal oxides. In one embodiment, the layer of filamentary resistor material 15 includes at least one bistable conductive filamentary pathway 50, wherein the at least one bistable conductive filamentary pathway 50 defines the contact area of the electrical contact 45 of the first electrode 10 to the memory cell 20. In one embodiment, the at least one conductive bistable filamentary pathway 50 is a laterally confined region with oxygen non-stoichiometry (for example, oxygen vacancies) within the matrix and across the depth of the layer of filamentary resistor material 15, wherein the oxygen vacancies provide doping of the transition-metal d-band that provides electrical communication from the first electrode 10 to the phase change material 30 of the memory cell 20. In another embodiment the at least one bistable conductive filamentary pathway 50 is a continuous series of metal interstitials or substitution metal atoms in a metal oxide lattice. In one embodiment, the layer of filamentary resistor material 15 comprises a doped or undoped transition metal oxide or complex metal oxide. In another embodiment the layer of filamentary resistor 15 comprises a doped or undoped $Cu_2S$.

In one embodiment, the memory device 100 includes a phase change memory cell 20 having switching region 16 at the electrical contact 45 of the at least one bistable conductive filamentary pathway 50 to the phase change material 30. In one embodiment, the switching region 16 is in an amorphous stage prior to the application of a voltage to the first electrode 10 and is in a crystalline stage upon the application of a voltage to the first electrode 10. In one embodiment, following the application of a voltage to the first electrode 10, the switching region 16 converts back to an amorphous phase once the voltage is removed.

As opposed to prior designs, in which the entire surface of the electrode is in direct physical contact with the phase change memory cell 20, the present invention reduces the contact area by employing the at least one bistable conductive filamentary pathway 50, as taught throughout this disclosure, wherein the surface of the at least one bistable conductive filamentary pathway 50 that contacts the phase change memory cell 20 has a surface area may range from about 180 $nm^2$ to about 5 $nm^2$. In one embodiment, the surface area of the electrical contact 45 may range from about 180 nm to about 5 $nm^2$. In another embodiment, the surface area of the electrical contact 45 may range from about 45 $nm^2$ to about 5 $nm^2$. In an even further embodiment, the surface area of the electrical contact 45 may range from about 16 $nm^2$ to about 5 $nm^2$.

In one embodiment, the present invention by reducing the contact area provides an increased current density at the electrical contact 45 of the first electrode 10 to the phase change material 30 of the memory cell 100. In one embodiment, the current density of the electrical contact 45 may range from about $1\times10^4$ $A/cm^2$ to about $1\times10^7$ $A/cm^2$. In another embodiment, the current density of the electrical contact 45 may range from about $5\times10^4$ $A/cm^2$ to about $5\times10^6$ $A/cm^2$. In an even further embodiment, the current density of the electrical contact 45 may range from about $1\times10^5$ $A/cm^2$ to about $1\times10^6$ $A/cm^2$.

In one embodiment, the present invention reduces the power budget to effectuate phase changes in the phase change memory cell 20. In another embodiment, the present invention reduces the power budget for storing data in the memory device 100 by confining the current path for effectuating the phase changes of the memory cell 20 to the at least one bistable conductive filamentary pathway 50.

Figure 2:
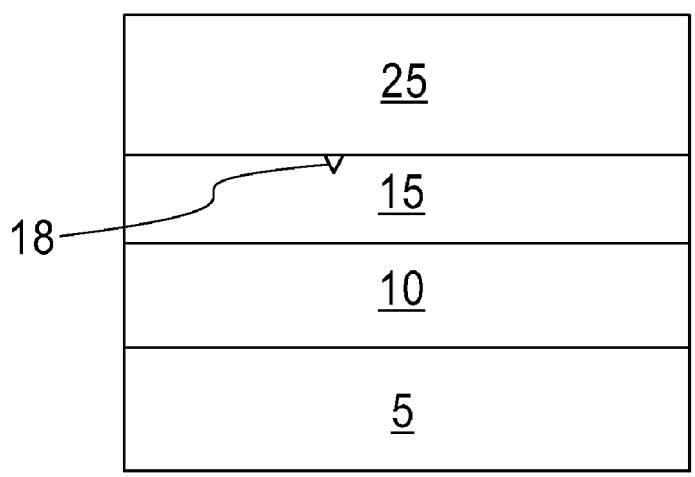
FIG. 2 is a side cross sectional view of one embodiment of an initial structure, which includes a substrate, a first conductive layer for a first electrode, a layer of a filamentary resistor material, and a layer of an interlevel dielectric, for a method of forming a memory device, in accordance with the present invention.
Figure 3:
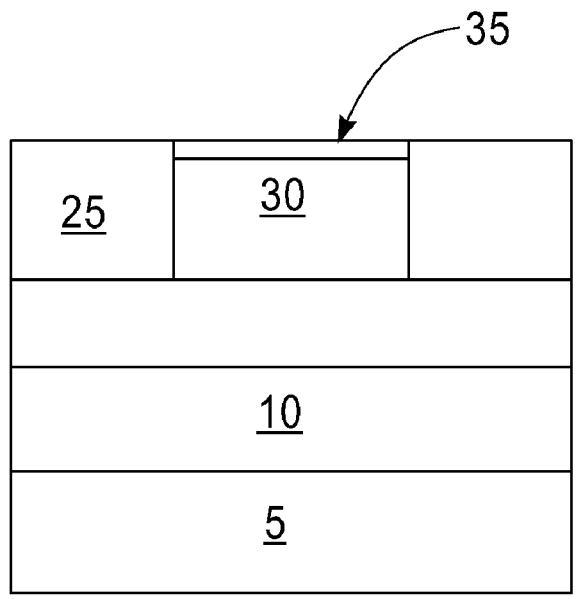
FIG. 3 is a side cross sectional view depicting one embodiment of forming a memory cell within the layer of the interlevel dielectric, in accordance with the present invention.
Figure 4:
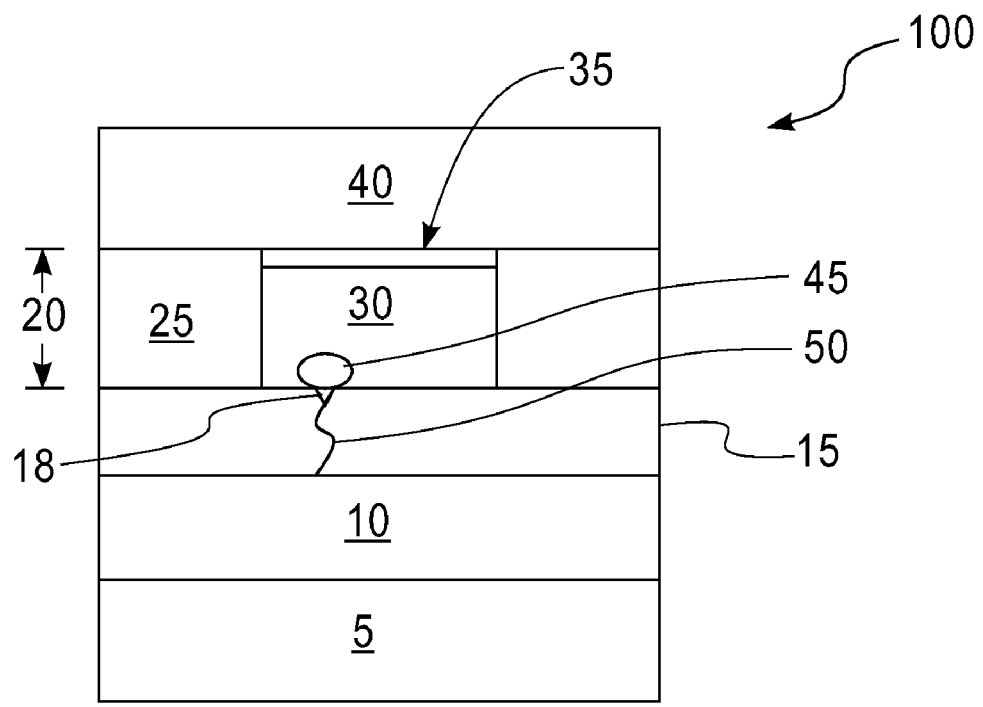
FIG. 4 is a side cross sectional view depicting one embodiment of applying an electric field to the filamentary resistor material to provide at least one bistable conductive filamentary pathway to the memory cell, in accordance with the present invention.

FIGS. 2-4 depict one embodiment of method for forming a memory device similar to the memory device 100 depicted in FIG. 1. It is noted that the following discussion is provided for illustrative purposes, and is not intended to limit the invention solely to the process steps discussed below, as additional process steps may be practiced without departing from the scope of the invention.

FIG. 2 depicts one embodiment of an initial structure that includes a substrate 5, a first conductive layer that provides the first electrode 10, a layer of the filamentary resistor material 15, and a layer of an interlevel dielectric 25, which may be used in accordance with the present method for forming the memory device 100. The stacked structure may be provided using deposition processes, such as physical vapor deposition (PVD) and/or chemical vapor deposition (CVD). Examples of physical vapor deposition (PVD) include sputtering and plating. Chemical vapor deposition (CVD) is a deposition process in which a deposited species is formed as a result of chemical reaction between gaseous reactants at greater than room temperature (25° C. to 600° C.); wherein solid product of the reaction is deposited on the surface on which a film, coating, or layer of the solid product is to be formed. Variations of chemical vapor deposition CVD processes include, but not limited to, Atmospheric Pressure CVD (APCVD), Low Pressure CVD (LPCVD), Plasma Enhanced CVD (PECVD), Metal-Organic CVD (MOCVD) and combinations thereof.

The substrate 5 may include any number of active and/or passive devices (or regions) located within the substrate 5 or on a surface thereof. For clarity, the active and/or passive devices (or regions) are not shown in the drawings, but are nevertheless meant to be included with substrate 5. For example, the substrate 5 may comprise any semiconductor material including, but not limited to: Si, Ge, SiGe, SiC, SiGeC, InAs, GaAs, InP and other III/V compound semiconductors. The substrate 5 may be undoped, or doped. In one example, the doping of a Si-containing substrate may be light (having a dopant concentration of less than $1E17$ atoms/cm$^3$) or heavy (having a dopant concentration of about $1E17$ atoms/cm$^3$ or greater). The substrate 5 can have any crystallographic orientation such as (100), (110) or (111). Hybrid substrates having at least two planar surfaces of different crystallographic orientation are also contemplated.

In one embodiment, the first conductive layer for the first electrode 10 is formed on an upper surface of the substrate 5. In one embodiment, the first electrode 10 may be a conductive material, such as Al, Ti, Cu, Ru, Rh, Pd, Ag, Ta, W, Ir, Pt, or alloys and combinations thereof, which is formed atop the substrate 5 utilizing a physical vapor deposition (PVD) process, such as plating or sputtering. In another embodiment, the first electrode is formed using a chemical vapor deposition (CVD) process. Following deposition, the layer of the conductive material may be subjected to a planarization process, such as chemical-mechanical polishing or grinding, to provide a planar structure. In one embodiment, although not depicted in the supplied figures, the first electrode 10 may be present on an interlevel dielectric layer, wherein the first electrode 10 is insulated from other conductive features and devices that may also be positioned in the same interlevel dielectric.

Still referring to FIG. 2, in one embodiment, the layer of the filamentary resistor material 15 comprises a transition metal oxide. In one embodiment of the present invention, the transition metal oxide is doped, and in another embodiment of the present invention, the transition metal oxide is not doped. In one embodiment, a transition metal oxide that may be used in the layer of the filamentary resistor material 15 may include, but is not limited to: $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, $NiO_x$, or $TiO_x$. In a further embodiment, the filamentary resistor material 15 is a transitional metal oxide with a perovskite or perovskite-like structure, wherein the transitional metal oxide may be doped with chromium, manganese, or vanadium. In one embodiment, the layer of the filamentary resistor material 15 can be amorphous, polycrystalline or epitaxial. In one embodiment, the layer of filamentary resistor material 15 can be deposited using physical vapor deposition (PVD), such as sputtering and/or plating, or may be deposited by chemical vapor deposition (CVD). For example, the layer of the filamentary resistor material 15 may be deposited using metal organic chemical vapor deposition (MOCVD), sputtering, Molecular Beam Epitaxy (MBE), atomic layer deposition (ALD), sol-gel, pulsed laser deposition (PLD) or combinations thereof.

The filamentary resistor material 15 is a material in which at least one bistable conductive filamentary pathway 50 with programmable resistance can be formed by applying a conditioning signal in the form of an electrical field to the layer of the filamentary resistor material 15. The programmable resistance is provided by a characteristic of the material that provides for several stable resistance states between which it is switchable. In other words, the material has a multistable, e.g., bi-stable resistance. In another embodiment, the filamentary resistor material 15 is a material in which such a confined bistable conductive filamentary pathway 50 can be formed by applying a thermal signal, a pressure signal, a radiation signal, or any other conditioning signal.

In one embodiment, the size and shape of the indentation 18 of the filamentary resistor material 15 is selected to generate a localized enhancement of the electrical field in the filamentary resistor material 15 and to position the bistable conductive filamentary pathway 50 to be formed. In one embodiment, the indentation 18 is formed on the upper surface of the filamentary resistor material using etch processes in combination with photolithography. For example, in one embodiment, following the deposition of the layer of the filamentary resistor material 15, a protective mask is formed exposing the portion of layer of the filamentary resistor material 15, in which the at least one bistable conductive filamentary pathway 50 is subsequently formed, and the exposed portion of the layer of the filamentary resistor material 15 is etched to provide the indentation 18. In another embodiment, the indentation 18 is formed in the bottom surface of the layer of the filamentary resistor material 15 is provided by creating a bump in the first electrode 10, and then depositing the layer of the filamentary resistor material 15 atop the upper surface of the first electrode 10 including the bump using a planarizing process. The term "planarizing" denotes that the top surface of the layer is planar.

In one embodiment, the filamentary resistor material 15 has a thickness ranging from about 400 nm to about 100 nm. In another embodiment, the filamentary resistor material 15 has a thickness ranging from about 10 nm to about 100 nm. In yet another embodiment, the filamentary resistor material 15 has a thickness ranging from about 10 nm to about 35 nm.

In one embodiment, the indentation 18 has a depth ranging from about 1 nm to about 20 nm, as measured from the upper surface of the layer of the filamentary resistor material 15 extending towards the first electrode 10. In another embodiment, the indentation 18 has a depth ranging from about 1 nm to about 10 nm. In yet another embodiment, the indentation 18 has a depth ranging from about 2 nm to about 5 nm. In one embodiment, the indentation 18 has a convex geometry.

In one embodiment, the at least one bistable conductive filamentary pathway 50 is not present in the initially formed layer of the filamentary resistor material 15. In one embodiment, the at least one bistable conductive filamentary pathway 50 is generated in a conditioning process. In one embodiment, the conditioning process includes applying a conditioning signal, e.g., a predetermined voltage to the layer of the filamentary resistor material 15 via at least one of the first and subsequently formed second electrodes 15, 40. In one embodiment, the conditioning process depends on the properties of the layer of the filamentary resistor material 15 (stoichiometry, doping, thickness, presence and density of lattice defects etc.), the surface properties and the shape of the first electrode 10 and the subsequently formed second electrodes 40, on the temperature and on other ambient parameters.

In one embodiment, the at least one bistable conductive filamentary pathway 50 is formed in a region of the filamentary resistor material 15 where the electrical field applied to the filamentary resistor material 15 is enhanced by the indentation 18. In one embodiment, the at least one bistable conductive filamentary pathway 50 forms at a location of the maximum electrical field that is induced in the layer of the filamentary resistor material 15, wherein the magnitude of the electrical field is increased by the indentation 18 having a convex feature. The indentation 18 may provide focalization of the electric field and reduces the probability of the least one bistable conductive filamentary pathway 50 forming in other places in the layer of the filamentary resistor material 15. Thus, in one embodiment of the present invention, the position of the at least one bistable conductive filament pathway 50 is predefined to the area adjacent the indentation 18.

The duration of the conditioning process depends on the magnitude of the electrical field. In one embodiment, due to the locally enhanced electrical field that is generated by the convex geometrical features protruding into the layer of filamentary resistor material 15, the duration of the conditioning signal for a secure conditioning process may be shortened when compared to a similarly prepared layer of filamentary resistor material 15 that does not include the indentation 18.

FIG. 3 depicts one embodiment of forming a memory cell 20 within the layer of the interlevel dielectric material 25. In one embodiment, the memory cell 20 includes a phase change material 30 in electrical contact with the bistable conductive filamentary pathway 50, and a barrier metal layer 35 formed atop the phase change material 30, wherein the barrier metal layer 35 may be positioned between the phase change material 30 and the second electrode 40.

The layer of interlevel dielectric material 25 includes any suitable insulating material that is typically employed in interconnects to electrical devices. This includes inorganic dielectrics, organic dielectrics and combinations thereof, including, multilayers thereof. Illustrative examples of suitable materials for interlevel dielectric layer 1 include, but are not limited to: $SiO_2$, Boron Phosphor Silicate Glass (BPSG) oxide, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or amorphous alloys of Si, O, F and H.

In one embodiment, the interlevel dielectric layer 25 is composed of a material having a dielectric constant greater than 3.5. In another embodiment, the interlevel dielectric layer 25 may have a dielectric constant that is from about 1.0 to about 3.0. Low-k dielectrics suitable for the interlevel dielectric layer 25 may include organic dielectrics such as low dielectric constant polymer dielectrics or may include low dielectric constant carbon-doped oxides. One example of a low-k dielectric polymer dielectric is SiLK™. Specifically, SiLK™ is a class of polymer-based low-k dielectric materials comprising a b-staged polymer having a composition including about 95% carbon. An example of a low dielectric constant carbon doped oxide is SiCOH.

In one embodiment, the layer of interlevel dielectric material 25 is formed atop the substrate 5 using deposition. More specifically, in one embodiment of the invention, the layer of interlevel dielectric 25 is formed atop the substrate 5 by a deposition process including, for example, chemical vapor deposition (CVD), evaporation, spin-on coating, or chemical solution deposition. Variations of CVD processes that are suitable for depositing the layer of interlevel dielectric material 25 include, but are not limited to, Atmospheric Pressure CVD (APCVD), Low Pressure CVD (LPCVD) Plasma Enhanced CVD (PECVD), Metal-Organic CVD (MOCVD) and combinations thereof.

In one embodiment, the layer of interlevel dielectric 25 has a thickness ranging from about 10 nm to about 1000 nm. In another embodiment, the interlevel dielectric has a dielectric 25 having a thickness ranging from 20 nm to about 200 nm. In yet another embodiment, layer of the interlevel dielectric 25 has a thickness ranging from about 30 nm to about 150 nm. In one embodiment, the interlevel dielectric 25 is composed of Boron Phosphor Silicate Glass (BPSG) oxide deposited to a thickness on the order of about 120 nm by CVD.

After forming the layer of interlevel dielectric layer 25 on a surface of the substrate 5, openings are formed through the interlevel dielectric layer 25 so as to expose portions of the underlying layer of filamentary resistor material 15. In one embodiment, the openings are formed through the interlevel dielectric layer 25 to expose the portions of the layer of filamentary resistor material 15, in which the bistable conductive filament pathway 50 are present or subsequently formed.

The openings are formed utilizing lithography and etching. For example, the lithographic step may include applying a photoresist to the layer of interlevel dielectric 25, exposing the photoresist to a pattern of radiation and developing the pattern into the exposed photoresist utilizing a resist developer. The etching step used in providing the opening in the layer of interlevel dielectric 25 may include chemical reactive ion etching (RIE), plasma etching, ion beam etching or laser ablation. Reactive Ion Etching is a form of plasma etching that during etching the surface to be etched is placed on the RF powered electrode, wherein the surface to be etched takes on a potential that accelerates the etching species extracted from a plasma toward the surface, to be etched in which the chemical etching reaction is taking place in the direction normal to the surface. Following etching, the photoresist is typically removed from the structure utilizing a resist stripping process, such as oxygen ashing.

Still referring to FIG. 2, in a following process step or sequence a phase change memory cell 20 is formed within the opening in the interlevel dielectric layer 25. In one embodiment, forming the phase change-memory cell 20 includes depositing a phase change material 30 within at least the openings. In one embodiment, the thickness of the phase change material 30 may range from about 10 nm to about 400 nm. In one embodiment, deposition of the phase change material 30 may include blanket deposition of the phase change material 30 followed by planarization to provide an upper surface of the phase change material 30 that is substantially coplanar with the upper surface of the interlevel dielectric layer 25.

In one embodiment, the phase change material 30 may be switched from an amorphous phase to a crystalline phase. When in an amorphous state, the phase change material 30 exhibits a high resistivity, typically ranging from about $10^2$ ohm-m to about $10^4$ ohm-m. When in a crystalline state, the phase change material 30 is more conductive, exhibiting a lower resistivity typically ranging from about $10^{-5}$ ohm-m to about $10^{-2}$ ohm-m. In one embodiment, the phase change material 30 may comprise chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material liner has a composition of $Ge_2Sb_2Te_5$ (GST). Although chalcogenides are a group of materials commonly utilized as phase change material, some phase change materials, such as GeSb, do not utilize, chalcogenides. Thus, a variety of materials can be used in a phase change material cell as long as they can retain separate amorphous and crystalline states of distinct resistivity.

In one embodiment, a phase change material 30 composed of GST when at a temperature of about 25° C. is in an amorphous phase. As the temperature of the GST phase change material is increased to about 125° C. to about 150° C., the resistivity of the phase change material decreases representing the transition temperature for a phase change from an amorphous phase to Face Center Cubic (FCC) phase. Further increases in the temperature of the GST phase change material to greater than about 180° C. result in further decreases in resistivity, which result from a phase change from the Face Centered Cubic (FCC) phase to a Hexagonal (Hex) phase of the GST. When the temperature of the GST phase change material is increased above the melting temperature (approximately 620° C.), the GST phase change material melts and upon quenching returns to the amorphous solid phase. Quenching denotes solidification in a time period on the order of about 0.5 to about 50 nanoseconds.

Still referring to FIG. 3, in one embodiment of the present invention, a barrier metal 35 is formed atop the phase change material 30. In one embodiment the barrier metal 35 is TiN, TaN or a combination thereof. In one embodiment, the barrier metal 35 is blanket deposited by a physical deposition process, such as sputtering. In another embodiment, the barrier metal 35 may be deposited by chemical vapor deposition. In one embodiment, the layer of barrier metal 35 may have a thickness ranging from about 20 nm to about 200 nm. In one embodiment following deposition, the barrier metal 35 is patterned and etched to correspond to the phase change material 30.

In another embodiment, the phase change material 30 may be recessed below the upper surface of the interlevel dielectric layer 25 prior to the deposition of the barrier metal 35. The phase change material 30 may be recessed using an etch process. In a following process step, the barrier metal 35 is deposited by a physical deposition process, or chemical vapor deposition, atop the recessed surface of the phase change material 30. In one embodiment, the barrier metal 35 is deposited to fill the recess and extend atop the upper surface of the interlevel dielectric layer 25. In a following process step, the barrier metal 35 may be planarized to provide an upper surface of the phase change material 30 that is substantially coplanar with the upper surface of the interlevel dielectric layer 25.

In another embodiment, the memory cell 20 is formed before the interlevel dielectric layer 25. More specifically, in embodiments of the present invention where the memory cell 20 is formed before the dielectric layer 25, the phase change material 30 is first deposited atop the layer of filamentary resistor material 15 and then a layer of barrier metal 35 is deposited atop the layer of the phase change material 30 to provide a metal barrier layer/phase change material stack. Thereafter, the barrier layer/phase change material stack is patterned and etched to provide a phase change memory cell 20 corresponding to the portion of the layer of filamentary resistor material 15, in which the at least one bistable conductive filament pathway 50 is present or subsequently formed. In a next process step, the layer of interlevel dielectric 25 is deposited atop the phase change memory cell 20 and the portions of the layer of filamentary resistor material 15 adjacent to the phase change memory cell 30. Thereafter, the layer of interlevel dielectric 25 may be planarized to be substantially coplanar with the upper surface of the memory cell 20.

FIG. 4 depicts one embodiment of forming a second electrode 40 atop the phase change memory cell 20 and applying an electric field to the layer filamentary resistor material 15 to provide at least one bistable conductive filamentary pathway 50 to the memory cell. In one embodiment, a conductive layer for the second electrode 40 is formed on at least an upper surface of the memory cell 20. In one embodiment, the conductive layer for the second electrode 40 is formed on the upper surface of the memory cell 20 and the upper surface of the interlevel dielectric 25. In one embodiment, the second electrode 40 may be a conductive material, such as Al, Ti, Cu, Ru, Rh, Pd, Ag, Ta, W, Ir, or Pt which is deposited utilizing a physical vapor deposition (PVD) process, such as plating or sputtering. In another embodiment, the second electrode 40 is formed using a chemical vapor deposition (CVD) process. Following deposition, the layer of the conductive material may be subjected to a planarization process, such as chemical-mechanical polishing or grinding, to provide a planar structure. In one embodiment, although not depicted in the supplied figures, the second electrode 40 may be present on an interlevel dielectric layer, wherein the second electrode 40 is insulated from other conductive features and devices that may also be positioned in the same interlevel dielectric.

In one embodiment of the present invention, the at least one bistable conductive filamentary pathway 50 is formed within the layer of the filamentary resistor material 15 following the formation of the second electrode 40. In one embodiment, the at least one bistable conductive filamentary pathway 50 is formed by producing an electric field within the layer of filamentary resistor material 15 by applying a voltage to at least one of the first and second electrode 15, 40. In one embodiment, the voltage that is provided to the first electrode 10 and/or second electrode 40 may range from about 1 volt to about 10 volts. In another embodiment, the voltage that is provided to the first electrode 10 and/or second electrode 40 may range from about 1 volt to about 2 volts. In one embodiment when the filamentary resistor material 15 is an amorphous layer, the conditioning process may locally transform the amorphous material to a crystalline structure.

In one example, the phase change memory cells may be conditioned to exhibit a hysteresis in the current voltage characteristics, that is, a bistable resistance state. In one embodiment, the bistable conductive filamentary pathway exhibits a low-resistance state of about 4 K ohm and a high-resistance state of about 400 K ohm (measured with a bias of less than 0.5 volts) after applying a small bias voltage of typically less than about +/−2 volts to switch the resistivity state.

In one embodiment, the two different resistivity states persist after removal of the applied electrical bias. In one embodiment, the conditioning (or forming process) consists of applying a larger voltage (typically 5 volts) across the material until a current of predetermined magnitude (typically 10 to 50 microamps) starts flowing. The required polarity of the forming voltage depends on the electrode material.

In one embodiment, the current direction as applied to the memory device is defined by selecting the sign (+/−) of the electrical bias. Typically, the current that flows from the anode into the cathode is defined as positive. In one embodiment of the present invention, when an initial bias of +2 volts is applied to the anode, a current of about 250 mA is produced at a resistance of about 4 Kohm (measured at less than 0.5 volts); and when an initial bias of −2 volts is applied to the anode, a current of about 250 mA is produced in a opposite direction to the current produced by the initial bias of +2 V, wherein the resistance is as great as about 100 Kohm (measured as less than 0.5 volts).

While the present invention has been particularly shown and described with respect to the preferred embodiments thereof it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. A memory device comprising:
   a phase change memory cell;
   a first electrode; and
   a layer of filamentary resistor material positioned between the phase change memory cell and the first electrode, wherein at least one bistable conductive filamentary pathway is present in at least a portion of the layer of filamentary resistor material that provides electrical communication between the phase change memory cell to the first electrode.

2. The device of claim 1, wherein the electrical communication between the phase change memory cell and the first electrode is provided by the at least one bistable conductive filamentary pathway that extends from the phase change memory cell and the first electrode.

3. The device of claim 1, wherein the layer of the filamentary resistor material comprises a transition metal oxide.

4. The device of claim 1, wherein the phase change memory cell comprises Ge, Sb, or Te or a combination thereof.

5. The device of claim 1, wherein the phase change memory cell comprises $Ge_2Sb_2Te_5$.

6. The device of claim 1, wherein the first electrode comprises a metal comprising Al, Cu, W, or alloys and combinations thereof.

7. The device of claim 1, wherein the first electrode comprises a barrier metal.

8. The device of claim 1, wherein the first electrode comprises TiN or TaN.

9. The device of claim 1 further comprising a barrier metal layer on a surface of the phase change material opposite the interface direct physical contact between the phase change memory cell and the layer of the filament resistor material.

10. The device of claim 9, wherein the barrier metal layer on the surface of the phase change memory cell opposite the direct physical contact between the phase change material and the layer of the filament resistor material comprises TiN or TaN.

11. The device of claim 9 further comprising a second electrode in contact with the barrier metal layer.

12. The device of claim 1 comprising a switching region at a contact of the at least one bistable conductive filamentary pathway to the phase change material.

13. The device of claim 12, wherein the switching region is in an amorphous stage prior to the application of a voltage to the first electrode.

14. The device of claim 12, wherein the switching region is at a crystalline stage upon the application of a voltage to the first electrode.

15. The device of claim 14, wherein following the application of a voltage to the first electrode the switching region converts to an amorphous phase once the voltage is removed.

* * * * *